(12) United States Patent
Fischer et al.

(10) Patent No.: US 7,244,336 B2
(45) Date of Patent: Jul. 17, 2007

(54) TEMPERATURE CONTROLLED HOT EDGE RING ASSEMBLY FOR REDUCING PLASMA REACTOR ETCH RATE DRIFT

(75) Inventors: Andreas Fischer, Castro Valley, CA (US); Peter Loewenhardt, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 200 days.

(21) Appl. No.: 10/736,666

(22) Filed: Dec. 17, 2003

(65) Prior Publication Data

US 2005/0133164 A1 Jun. 23, 2005

(51) Int. Cl.
C23F 1/00 (2006.01)

(52) U.S. Cl. .................. 156/345.51; 156/345.47; 118/728; 118/723 E

(58) Field of Classification Search .......... 156/345.43, 156/345.44, 915, 500, 728; 118/723 E
See application file for complete search history.

(56) References Cited

U.S. PATENT DOCUMENTS

| | | | |
|---|---|---|---|
| 6,073,577 A | | 6/2000 | Lilleland et al. |
| 6,159,299 A | * | 12/2000 | Koai et al. .................. 118/715 |
| 6,238,513 B1 | * | 5/2001 | Arnold et al. ......... 156/345.54 |
| 6,251,215 B1 | * | 6/2001 | Zuniga et al. ......... 156/345.14 |
| 6,277,008 B1 | * | 8/2001 | Masuta et al. .............. 451/286 |
| 6,344,105 B1 | | 2/2002 | Daugherty et al. |
| 6,363,882 B1 | | 4/2002 | Hao et al. |
| 6,383,931 B1 | | 5/2002 | Flanner et al. |
| 6,391,787 B1 | | 5/2002 | Dhindsa et al. |
| 6,475,336 B1 | | 11/2002 | Hubacek |
| 6,567,258 B2 | | 5/2003 | Sexton et al. |
| 6,589,352 B1 | | 7/2003 | Yudovsky et al. |
| 6,896,765 B2 | * | 5/2005 | Steger ................... 156/345.51 |

OTHER PUBLICATIONS

International Preliminary Report on Patentability and Written Opinion dated Jun. 20, 2006 for PCT/US2004/041768.
International Search Report and Written Opinion dated Oct. 13, 2005 for PCT/US04/41768.

* cited by examiner

*Primary Examiner*—Sylvia R. MacArthur
(74) *Attorney, Agent, or Firm*—Buchanan Ingersoll & Rooney PC

(57) ABSTRACT

A temperature-controlled hot edge ring assembly adapted to surround a substrate support in a plasma reaction chamber. The assembly includes a conductive lower ring, a ceramic intermediate ring, and an upper ring. The intermediate ring overlies the lower ring and is adapted to be attached via the lower ring to an RF electrode. The upper ring overlies the intermediate ring, and has an upper surface exposed to an interior of a plasma reaction chamber.

25 Claims, 5 Drawing Sheets

TEMPERATURE CONTROLLED HOT EDGE RING ASSEMBLY FOR REDUCING PLASMA REACTOR ETCH RATE DRIFT

BACKGROUND

Since the mid-1960s, integrated semiconductor circuits have become the primary components of most electronics systems. These miniature electronic devices may contain thousands of the transistors and other circuits that make up the memory and logic subsystems of microcomputer central processing units and other integrated circuits. The low cost, high reliability, and speed of these chips have led them to become a ubiquitous feature of modem digital electronics.

The fabrication of an integrated circuit chip typically begins with a thin, polished slice of high-purity, single-crystal semiconductor material substrate (such as silicon or germanium) called a "wafer." Each wafer is subjected to a sequence of physical and chemical processing steps that form the various circuit structures on the wafer. During the fabrication process, various types of thin films may be deposited on the wafer using various techniques such as thermal oxidation to produce silicon dioxide films, chemical vapor deposition to produce silicon, silicon dioxide, and silicon nitride films, and sputtering or other techniques to produce other metal films.

After depositing a film on the semiconductor wafer, the unique electrical properties of semiconductors are produced by substituting selected impurities into the semiconductor crystal lattice using a process called doping. The doped silicon wafer may then be uniformly coated with a thin layer of photosensitive, or radiation sensitive material, called a "resist." Small geometric patterns defining the electron paths in the circuit may then be transferred onto the resist using a process known as lithography. During the lithographic process, the integrated circuit pattern may be drawn on a glass plate called a "mask" and then optically reduced, projected, and transferred onto the photosensitive coating.

The lithographed resist pattern is then transferred onto the underlying crystalline surface of the semiconductor material through a process known as etching. Vacuum processing chambers are generally used for etching and chemical vapor deposition (CVD) of materials on substrates by supplying an etching or deposition gas to the vacuum chamber and application of a radio frequency (RF) field to the gas to energize the gas into a plasma state. However, in plasma processing of wafers, process drift (i.e., the change of process performance over a certain amount of time) can occur. Accordingly, there is a need for apparatuses and methods for improving etch rate uniformity in plasma reactor processing.

SUMMARY

In accordance with one embodiment, a temperature-controlled hot edge ring assembly adapted to surround a substrate support in a plasma reaction chamber includes a conductive lower ring; a ceramic intermediate ring, the intermediate ring overlying the lower ring, the intermediate ring adapted to be attached via the lower ring to an RF electrode; and an upper ring, the upper ring overlying the intermediate ring, wherein the upper ring has an upper surface exposed to an interior of a plasma reaction chamber.

In accordance with another embodiment, a plasma processing apparatus includes a processing chamber; a power source which energizes process gas in an interior of the processing chamber into a plasma state for processing a substrate; a substrate support which supports a substrate within the interior of the processing chamber; a conductive lower ring; a ceramic intermediate ring, the intermediate ring overlying the lower ring, the intermediate ring adapted to be attached via the lower ring to an RF electrode; and an upper ring, the upper ring overlying the intermediate ring, wherein the upper ring has an upper surface exposed to an interior of a plasma reaction chamber.

In accordance with a further embodiment, a method of reducing process drift on a plurality of substrates in a plasma processing system, the method including the steps of: positioning a substrate in a plasma processing apparatus comprising: a processing chamber; a power source which energizes process gas in an interior of the processing chamber into a plasma state for processing a substrate; a substrate support which supports a substrate within the interior of the processing chamber, the substrate support having an upper surface; and an edge ring assembly comprising: a conductive lower ring; a ceramic intermediate ring, the intermediate ring overlying the lower ring, the intermediate ring adapted to be attached via the lower ring to the power source; and an upper ring, the upper ring overlying the intermediate ring, wherein the upper ring has an upper surface exposed to an interior of the processing chamber; supplying process gas to the chamber; forming a plasma adjacent the upper surface of the substrate support; and sequentially processing a plurality of substrates in the plasma processing apparatus, wherein the temperature of the upper ring is substantially cooled to an initial temperature after a first substrate is removed from the substrate support and before a subsequent substrate is placed on the substrate support to reduce process drift.

DETAILED DESCRIPTION

Figure 1:
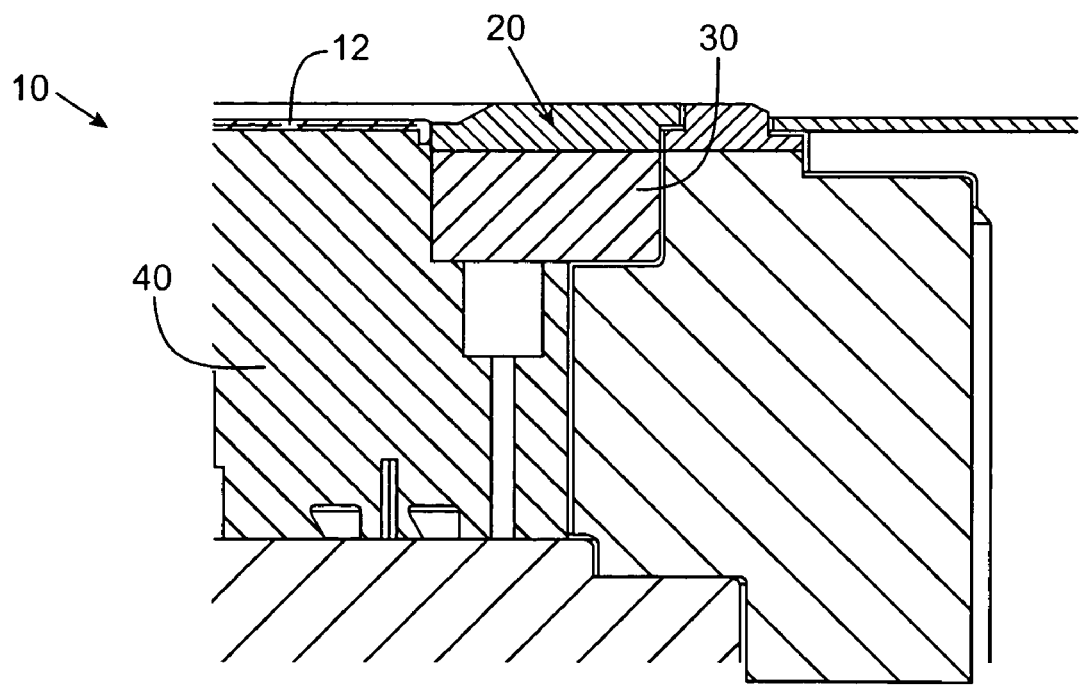
FIG. 1 shows a cross sectional view of a portion of a vacuum processing chamber having a hot edge ring and a quartz coupling ring.

The hot edge ring assembly as disclosed herein provides a novel arrangement for improving uniformity and reducing etch rate drift at the edge of a wafer during plasma processing of semiconductor substrates such as wafers (e.g. silicon or gallium arsenide (GaAs)), flat panel display substrates, and the like. A temperature-controlled hot edge ring assembly can achieve improved plasma processing. The temperature-controlled hot edge assembly increases the thermal contact between the upper ring having an exposed surface to the plasma processing chamber and a temperature controlled radio frequency (RF) electrode incorporated in a substrate support. Thus, by increasing the thermal contact, the hot edge ring assembly can reduce processing etch rate drift.

In processing substrates, process engineers strive to improve process uniformity. As the term is employed herein, process uniformity refers to the uniformity of the entire process, such as plasma etching across the surface of the substrate. If the process is highly uniform, for example, it is expected that the process rates at different points on the substrate tend to be substantially equal.

For control of etch rate uniformity on a semiconductor substrates, such as a wafer, in particular, for matching the etch rate at the center of the wafer to the rate at the wafer edge, wafer boundary conditions are preferably designed for assuring continuity across the wafer in regard to the chemical exposure of the wafer edge, process pressure, and RF field strength. In the current designs, an edge ring has been implemented fitting around the wafer. In order to minimize wafer contamination, the edge ring is manufactured from a material compatible to the wafer itself. As an example, typical edge ring materials can include silicon, graphite, silicon carbide or the like.

Typically, the edge ring is resting on a ring made of quartz, (i.e., a quartz coupling ring), which is placed on the outer periphery of the RF electrode. Due to its low dielectric constant quartz is typically chosen for tapering the RF field strength at the edge of the wafer to enhance etch rate uniformity. On the other hand, quartz is also known to be a poor thermal conductor. As a result, an edge ring overlying a quartz coupling ring is thermally insulated. Thus, since the plasma is in the vicinity of the edge ring, the plasma heats the edge ring and may cause overheating of the edge ring and result in processing problems with the substrate or wafer. Upon exposure to a heat source such as the RF plasma, the edge ring cannot cool adequately, which leads to a steady rise of its temperature. This temperature rise can lead to process drift (i.e., process non-uniformity) in etch rate at the edge of the wafer when multiple wafers are processed in close succession. Accordingly, since process drift can be caused by the steady increase in the temperature of the edge ring over the processing of multiple wafers, what is needed is a hot edge ring assembly, which allows improved cooling of the edge ring before the next substrate is processed and thereby reduces etch rate drift.

The edge ring assembly may be applied to plasma etching processes to enhance the density of a plasma near the edge of a wafer in a parallel plate plasma reaction chamber to produce a more uniform etch rate across the substrate. Although the hot edge ring assembly will be described in terms of its advantages for plasma etching, the hot edge ring assembly is also useful for other applications that may require plasmas with uniform densities such as plasma enhanced chemical vapor deposition and plasma cleaning.

The etch rate near the edge of the wafer can be controlled by modifying the quartz coupling ring and the edge ring to allow for sufficient cooling of the edge ring. According to a preferred embodiment, the edge ring assembly is heat sunk to the temperature controlled RF electrode. In one embodiment, a thermally conductive elastomer bonds the edge ring to the coupling ring.

Typically, during the plasma etching process, the temperature of the edge ring rises due to the effects of the plasma. Depending on the RF power level and chamber pressure, the temperature rise can be significant and often exceed several dozen degrees Celsius. After the plasma etching-processing step is finished, the wafer is removed from the RF electrode and the next wafer is placed on the substrate support. If the edge ring temperature increases too much during a process run, wherein a batch of wafers undergoes sequential etching, the etch rate can drift outside the process window and result in defective wafers. It is desirable that before another wafer is added to the substrate support that the edge ring has sufficient heat sinking to allow the edge ring to return a temperature range as used for processing the previous wafer. However, this often does not occur, which leads to etch rate drift during the processing of a plurality of wafers.

FIG. 1 shows a cross-sectional view of a wafer edge region of a standard vacuum-processing chamber 10. As shown in FIG. 1, a substrate or wafer is mounted on a substrate support 12 preferably incorporating an electrostatic chuck therein. The wafer edge ring assembly typically includes an edge ring 20 and a coupling ring 30. The edge ring 20 can be bonded to the coupling ring 30 or can be resting flush on the coupling ring 30. The vacuum-processing chamber 10 also includes a radio frequency (RF) powered electrode 40 beneath the substrate support, which provides radio frequency energy to the substrate supported thereon.

A suitable RF impedance matching circuit capacitively couples RF power into the chamber 10 via powered electrode 40 so as to provide high-density plasma. If desired, other plasma generating sources can be used (e.g., inductively-coupled coils, electron-cyclotron resonance (ECR), helicon or magnetron type). The chamber 10 also includes a suitable vacuum pumping apparatus for maintaining the interior of the chamber at a desired pressure (e.g., at 50 mTorr, typically 30-1000 mTorr). A gas distribution plate, commonly called a showerhead, may be provided and includes a plurality of openings such as circular holes (not shown) for delivering process gas supplied by a gas supply to the processing chamber 10. However, the gas distribution plate can be omitted and process gas can be supplied to the chamber by other arrangements such as gas rings, etc.

As is well known to those familiar with the plasma processing art, the rings surrounding the substrate support, including the hot edge ring 20 and the coupling ring 30 help focus the ions from the RF induced plasma region on the surface of the substrate to improve process uniformity, particularly at the edge of the substrate. When power is supplied to the substrate and electrostatic chuck, equipotential field lines are set up over substrate and bottom electrode. These field lines are not static but change during the RF cycle. The time averaged field results in the bulk plasma being positive and the surface of the substrate and electrostatic chuck negative. Due to geometry factors, the field lines are not uniform at the edge of the substrate. In the plasma chamber, the coupling, and hot edge rings help direct the bulk of the RF coupling through substrate to the overlying plasma by acting as a capacitor between the plasma and the powered electrode.

As shown in FIG. 1, the edge ring 20 is a sacrificial ring surrounding the substrate support 12. The edge ring 20 is a replaceable component, which tends to become hot during processing of a substrate and thus is referred to as a hot edge ring (HER). The hot edge ring 20 can be made from conductive electrode materials such as silicon carbide (SiC) and silicon (Si) or from dielectric materials such as quartz. It has been shown that, besides shifting the chemistry in the immediate neighborhood of the edge ring, by changing the edge ring material, the degree of coupling through the plasma can be tailored to provide a desired localized "edge" etch rate at the outer portion of a substrate being processed.

Silicon carbide having a lower capacitive impedance, will generally produce a faster edge etch rate than silicon oxide. Quartz and other dielectrics with low dielectric constants will tend to lower the edge etch rate due to a reduction in RF coupling at the wafer edge. Typically, the coupling ring 30 is made of a dielectric semi-conductive material such as quartz, silicon, silicon carbide, or aluminum oxide.

Figure 2:
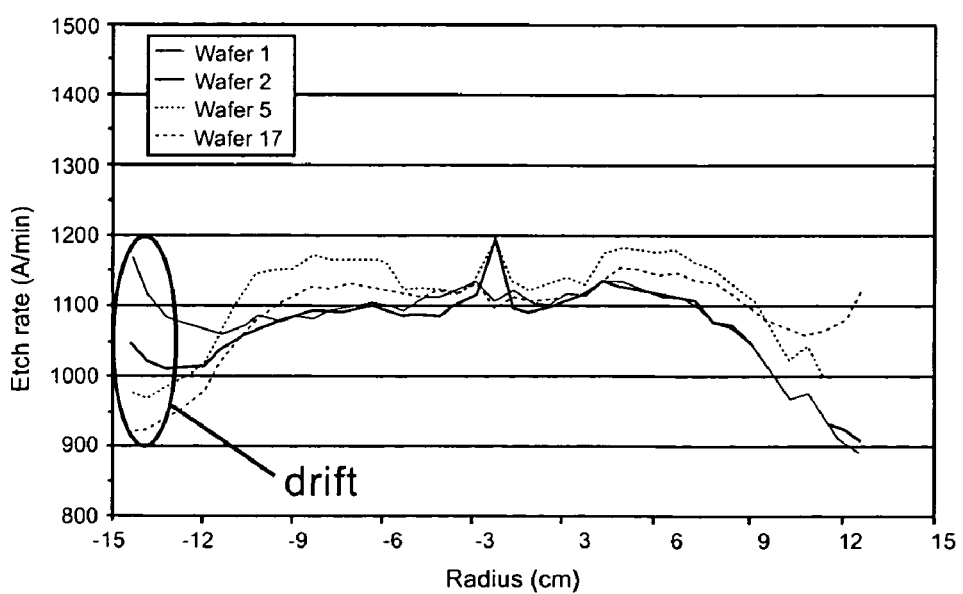
FIG. 2 is a graph showing process drift for a plurality of wafers having a coupling ring and hot edge ring as set forth in arrangement of FIG. 1.

FIG. 2 is a graph showing the etch rate profile in a blanket oxide etch using a parallel plate arrangement with a dual frequency power supply. A run of seventeen (17) wafers was processed. A silicon edge ring 20 and quartz coupling ring 30 were used and etching was carried out under the following conditions: 2000 Watts RF power at 27 MHz; 2000 Watts RF power at 2 MHz; 150 mTorr chamber pressure above the wafer; 400 sccm argon gas; 80 sccm $C_4F_8$ gas; 8 sccm $O_2$ gas; and 60 second process time.

The graph shows the Photoresist etch rate in Angstroms/minute as a function of location on the wafer surface measured from the center of the wafer. As can be seen from the graph, the etch rate at the edge of wafer varies substantially from wafer to wafer. Etch rate uniformity is calculated by the following equation:

[(Max−Min)/2*Average]*100% where Max is the maximum value of etch rate and Min is the minimum value of etch rate. The etch rate was determined by measuring the thickness of the Photoresist layer on top of the wafer before and after etching using a commercially available thin-film metrology system.

Figure 3:
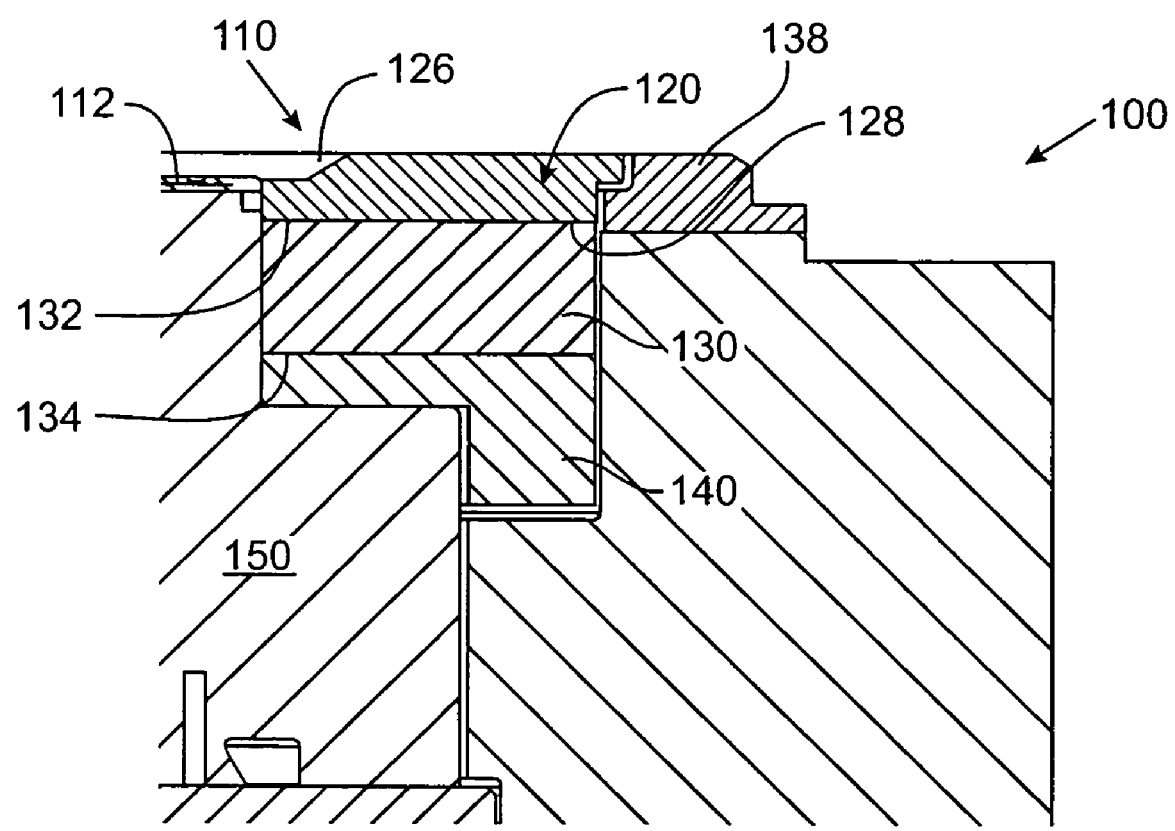
FIG. 3 shows a cross sectional view of an edge ring assembly according to one embodiment.

FIG. 3 shows a cross section of a wafer edge region of a parallel plate plasma apparatus 100 having a temperature-controlled hot edge ring assembly 110 adapted to surround a substrate support according to one embodiment. The edge ring assembly 110 includes an upper hot edge ring 120, a ceramic intermediate ring 130, and a conductive lower ring 140. The intermediate ring 130 has an upper surface 132 and a lower surface 134, wherein the lower surface 134 of the intermediate ring 130 is thermally coupled to a radio frequency (RF) electrode 150 via the lower ring 140.

The upper ring 120 is preferably made of a thermally and electrically conductive material such as silicon, carbon (e.g., graphite), silicon carbide and the like. As shown in FIG. 3, a lower surface 128 of the upper ring 120 is preferably bonded to an upper surface 132 of the intermediate ring 130 by a thermally conductive elastomer. Details of suitable elastomers are described in U.S. Pat. No. 6,073,577, which is hereby incorporated by reference.

In one embodiment, an inner portion of the upper surface 126 of the upper ring 120 is beveled to form an angle with a plane perpendicular to the electrostatic chuck 112. The beveled inner surface 126 of the upper ring 120 allows a portion of the upper ring 120 to extend under the substrate when the substrate is located on the substrate support. The upper ring 120 preferably has a substantially rectangular cross section, with the exception of the beveled inner surface 126. It can be appreciated that the upper ring 120 can have other cross sectional designs or shapes.

If desirable, a dielectric outer ring 138 can surround the upper ring 120. The dielectric outer ring 138 can be formed of aluminum oxide ($Al_2O_3$), silicon oxide (quartz), silicon nitride, silicon carbide or other suitable materials and provides added protection to the plasma reactor chamber.

The intermediate ring 130 has a substantially rectangular cross-section and is preferably made of a material with high thermal conductivity and a similar thermal expansion coefficient as the material ring 120 is made of. If ring 120 is made out of silicon such materials may be aluminum oxide (ceramic), silicon, silicon carbide, or aluminum nitride. In one embodiment, the intermediate ring 130 is made of alumina. The intermediate ring 130 overlies the lower ring 140 and is preferably bolted to an RF electrode 150 via the lower ring 140.

The conductive lower ring 140 is preferably made of a conductive material such as aluminum, aluminum alloy, brass, copper, copper alloy or stainless steel. In one embodiment, the lower ring 140 has a substantially L-shaped cross section and is made of aluminum. However, it can be appreciated that the lower ring 140 can have a substantially rectangular cross section or other cross-sectional shape.

Figure 4:
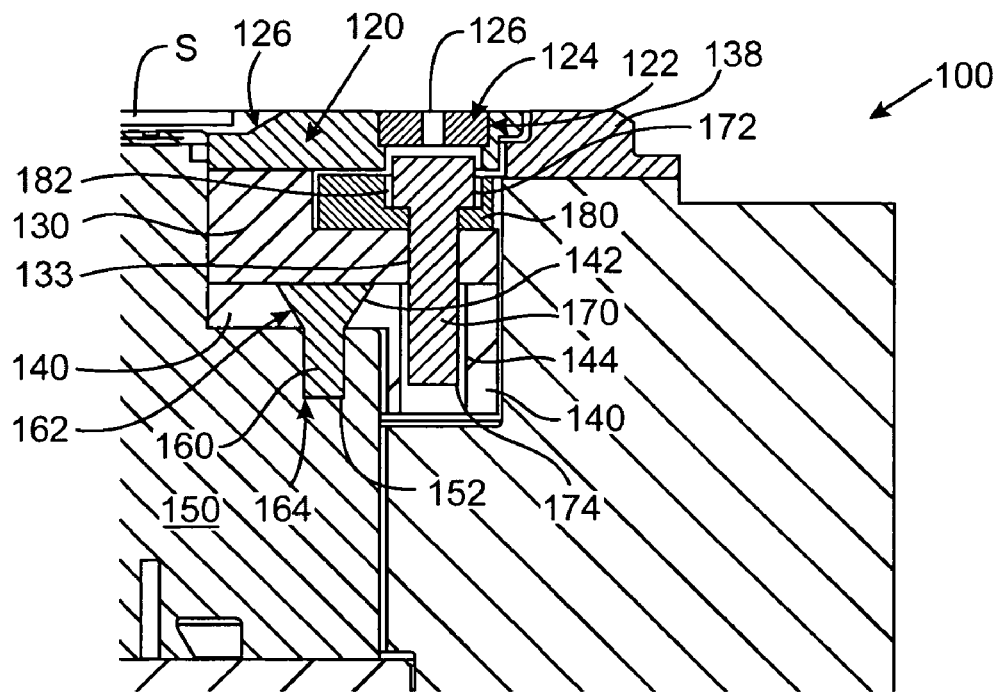
FIG. 4 shows a cross sectional view of a portion of a vacuum processing chamber according to FIG. 3 at the location where the coupling ring is thermally coupled to the RF electrode via a conductive lower ring.

FIG. 4 is a cross section of the edge ring assembly 110 of FIG. 3, wherein the intermediate ring 130 is bolted to the RF electrode 150 via the lower ring 140. The bolting of the intermediate ring 130 to the RF electrode 150 is preferably performed at a plurality of locations in the edge ring assembly 110 using a set of bolts (a first bolt 160 and a second bolt 170) extending through a plurality of holes in the lower ring 140.

As shown in FIGS. 3 and 4, the conductive lower ring 140 is preferably L-shaped in cross section having a first plurality of holes 142 for bolting the lower ring 140 to the RF electrode 150 and a second plurality of threaded holes 144 for bolting the intermediate ring 130 to the lower ring 140. The first plurality of holes 142 is preferably located in the inner portion of the lower ring 140 whereas holes 144 are located at the outer portion of the lower ring 140.

In one embodiment, the first plurality of holes 142 has a taper 162 for receiving a taper head of the first bolt 160. The bolt 160 extends from the upper surface of the lower ring 140 through the lower ring 140 and into the RF electrode 150. Preferably, the bolt 160 has a tapered head 162 at one end and a screw thread on the other end 164. The RF electrode 150 receives the screw thread 164 of the bolt 160 in a threaded hole 152. The bolt 160 is preferably stainless steel, however it can be appreciated that the first bolt can be aluminum, aluminum alloy, nickel, brass, copper, copper alloy or other suitable materials.

The bolting of the intermediate ring 130 to the lower ring 140 is preferably performed through a second plurality of holes 144 in the intermediate ring 130. The second plurality of holes 144 extend preferably into the outer portion of the lower ring 140. In one embodiment, the intermediate ring 130 has a plurality of bolt receiving holes 133 for receiving a conductive washer 180 and a second bolt 170. The bolt 170 has a head 172 at one end and a screw thread 174 at the other. The conductive washer 180 includes a counter-sunk hole 182 configured to receive the head 172 of the bolt 170 and the bolt 170 itself. The conductive washer 180 preferably rests in the plurality of bolt receiving holes 133. In addition, it can be appreciated that the conductive washer 180 can be made of aluminum, aluminum alloy, nickel, brass, copper, copper alloy, stainless steel or any suitable material.

The head 172 of the second bolt 170 is positioned in the conductive washer 180 and extends through the intermediate ring 130 and into the lower ring 140. The second bolt 170 is also preferably stainless steel, however it can be appreciated that the bolt 170 can be aluminum, aluminum alloy, nickel, brass, copper, copper alloy or any suitable material.

As shown in FIG. 4, the upper ring 120 has a plurality of holes 122 for receiving an edge ring cap 124. The edge ring cap 124 includes a vent hole 126 for venting of pressure in the edge ring assembly 110. The edge ring cap 124 preferably rests on a lip in hole 122 without touching the top of bolt 170. The edge ring cap 124 is preferably made of the same material as the upper ring 120. Accordingly, the edge ring cap 124 can be made of silicon, graphite, silicon carbide and any other suitable material. Alternatively, the edge ring cap 124 can be made of quartz.

Since, the edge ring assembly 110 surrounds a substrate in a plasma reactor, the bolting of the lower ring 140 to the RF electrode 150 is preferably performed at a plurality of locations in the edge ring assembly 110. In one embodiment, the number of holes 144, 152 is about 6 to 18 depending on the size of the edge ring assembly 110. For example, a plasma processing chamber for processing wafers having a diameter of 8 inches (200 mm) may have a different number of holes 144, 152, than a processed wafer having a diameter of 12 inches (300 mm). It can be appreciated that any number of first bolts 160, second bolts 170, and edge ring caps 124 can be used to affix the edge ring assembly 110 to the RF electrode 150.

Figure 5:
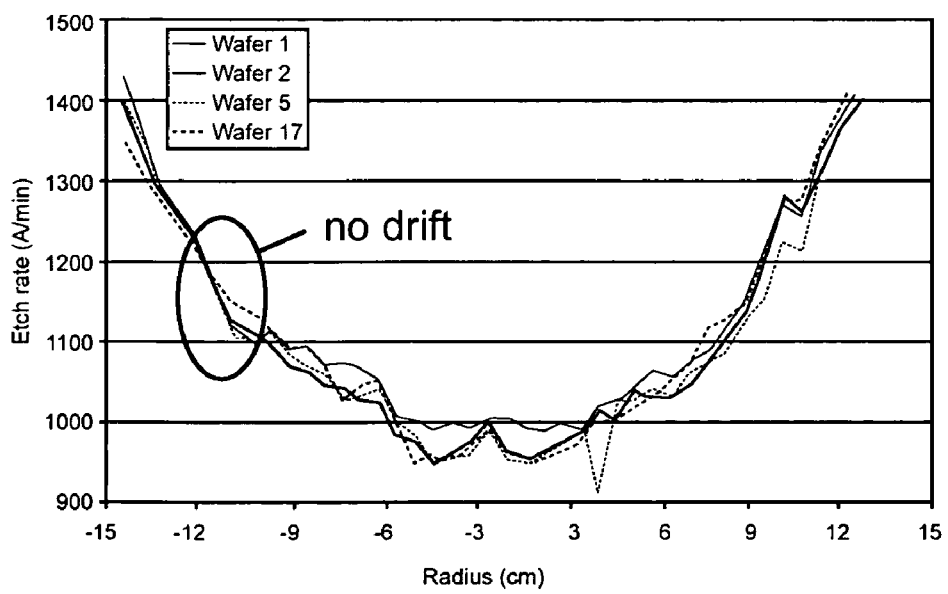
FIG. 5 is a graph showing process drift for a plurality of wafers having a intermediate ring and hot edge ring as set forth in arrangement of FIGS. 3 and 4.

FIG. 5 is a graph showing the effect of the hot edge ring 110 to the embodiment shown in FIGS. 3 and 4. The same process conditions as shown in FIG. 2 were used and were as follows: 2000 Watts RF power at 27 MHz; 2000 Watts RF power at 2 MHz; 150 mTorr chamber pressure above the wafer; 400 sccm argon gas; 80 sccm $C_4F_8$ gas; 8 sccm $O_2$ gas; and 60 second process time.

As shown in FIG. 5, the temperature-controlled hot edge ring assembly 110 greatly reduces the etch rate drift near the wafer edge. During a process run of a cassette of wafers, wafers number 1, 2, 5 and 17 showed very little variance of etch rate at the outer portion of the wafer versus the results using the standard hot edge ring as shown in FIG. 1 resulting in a fairly large etch rate drift at the edge of the wafer as shown in FIG. 2.

Figure 6:
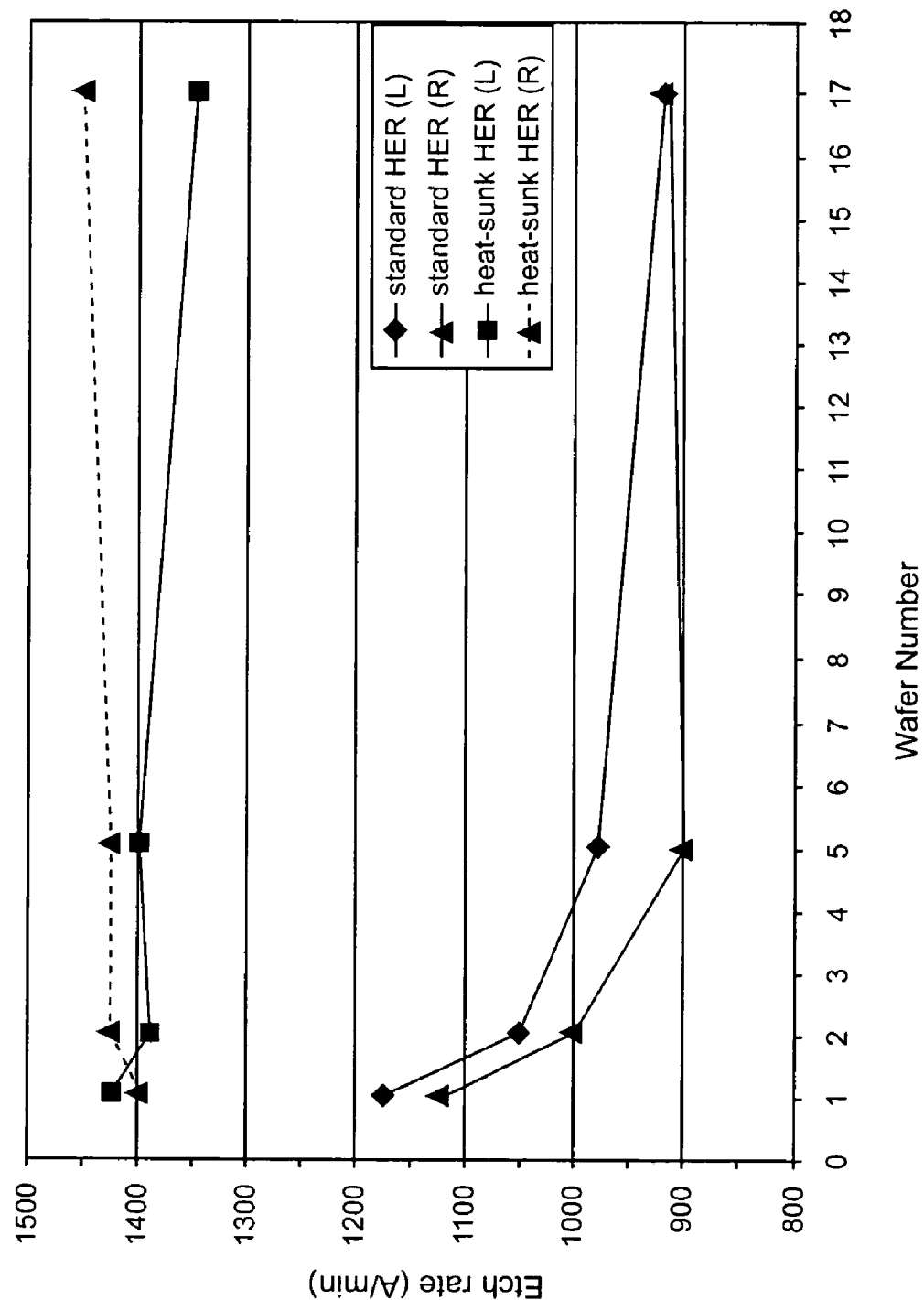
FIG. 6 is a graph showing process drift for a plurality of wafers comparing the hot edge ring of FIG. 1 versus the hot edge ring of FIGS. 3 and 4.

FIG. 6 graphs the etch rated at the edge of a wafer versus wafer number, comparing the standard quartz coupling ring as shown in FIG. 1 with the temperature controlled edge ring according to one embodiment and as shown in FIGS. 3 and 4. Whereas the standard hot edge ring resulted in a considerable drop in etch rate for wafers number 1-5, and a low etch rate for wafers 6-17, the heat sunk hot edge ring resulted in a much higher etch rate which was substantially constant for the entire batch of wafers. Thus, the heat sunk hot edge ring eliminated the process drift in etch rate shown by the standard hot edge ring.

It can be appreciated that the temperature-controlled hot edge ring assembly 110 can be installed in new vacuum processing chambers or used to retrofit existing vacuum processing chambers to provide adjustability of the upper ring 120.

It should be appreciated that in a specific system, the specific shape of the upper ring 120, the intermediate ring 130, and the lower ring 140 may vary depending on the arrangement of chuck, substrate and/or others. Therefore, the exact shape of the rings surrounding the chuck in FIGS. 3 and 4 are shown for illustration purposes only and are not limiting in any way.

Figure 7:
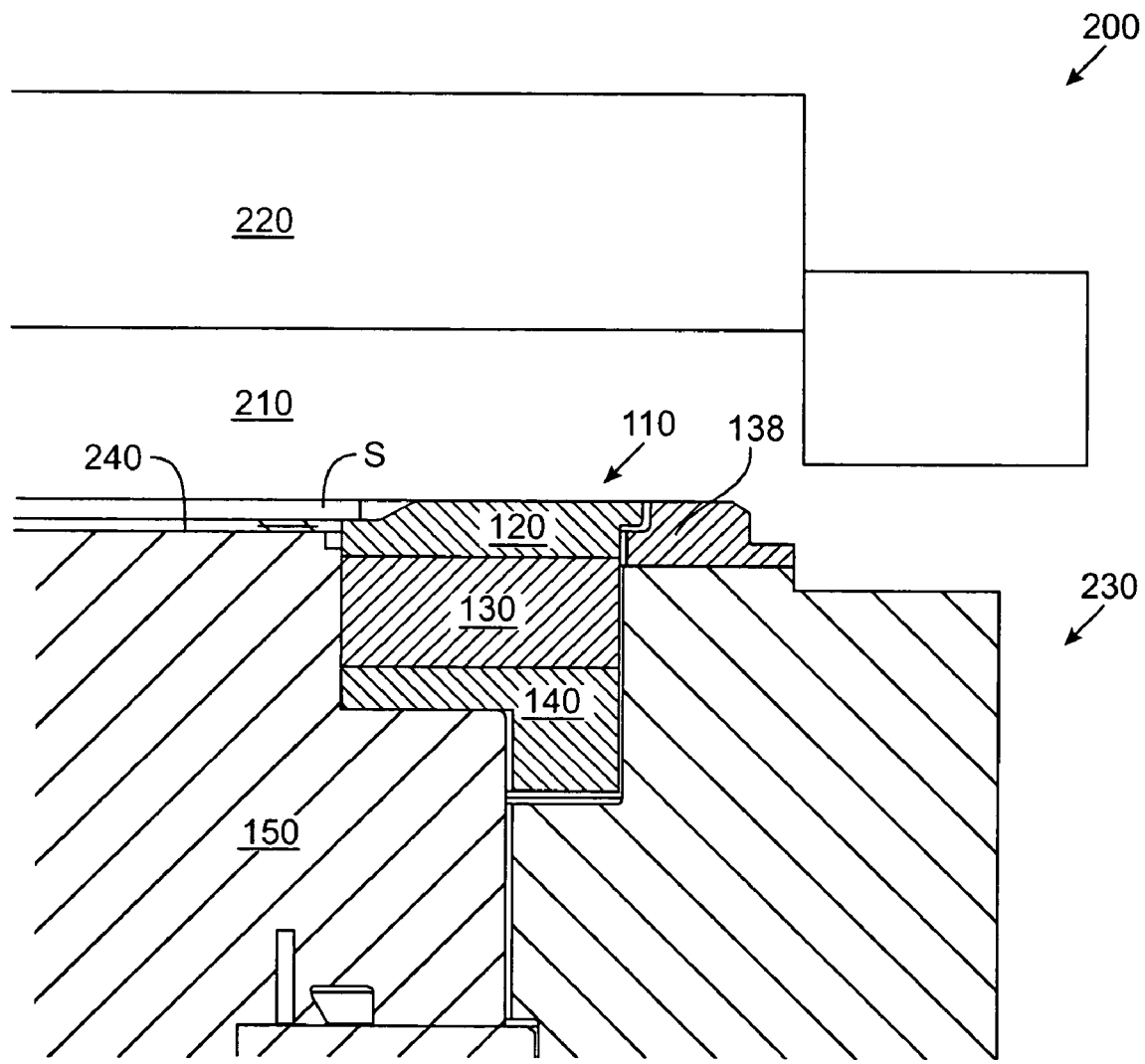
FIG. 7 shows a cross sectional view of a plasma processing apparatus incorporating the edge ring assembly of FIGS. 3 and 4.

FIG. 7 shows a parallel plate plasma processing apparatus 200 incorporating the edge ring assembly 110 according to one embodiment. The plasma processing apparatus 200 forms a processing chamber 210 having a top electrode 220, and a temperature controlled lower electrode 150 incorporated in a substrate support 230 having an electrostatic chuck 240 for clamping the substrate S. The RF electrode 150 energizes a process gas in the interior of the processing chamber 210 into a plasma state for processing a substrate S. An edge ring assembly 110, including an upper ring 120, a ceramic intermediate ring 130 and a conductive lower ring 140 as shown in FIGS. 3 and 4 surrounds the substrate support 240. A preferred plasma reaction chamber incorporating the edge ring assembly 110 is a semiconductor plasma etching apparatus.

In operation, when sequentially processing a plurality of substrates in the plasma processing apparatus 200, the temperature of the edge ring assembly 110 is substantially cooled to an initial temperature after a first substrate is removed from the electrode and before a subsequent substrate is placed on the electrode. As shown in FIGS. 3, 4 and 7, the edge ring assembly 110 incorporating the upper ring 120, the ceramic intermediate ring 130 and the conductive lower ring 140 provides an improved thermal path between the upper ring 120 and the temperature-controlled RF electrode 150. Thus, it can be appreciated that by cooling the edge ring assembly 110 to its initial temperature, the edge ring assembly 110 can reduce process drift.

Although the present invention has been described in connection with preferred embodiments thereof, it will be appreciated by those skilled in the art that additions, deletions, modifications, and substitutions not specifically described can be made without departing from the spirit and scope of the invention as defined in the appended claims.

What is claimed is:

1. A temperature-controlled hot edge ring assembly adapted to surround a semiconductor substrate support in a plasma reaction chamber, the assembly comprising:
    a lower ring made of an electrically conductive material;
    a ceramic intermediate ring, the intermediate ring overlying the lower ring, the intermediate ring adapted to be attached via the lower ring to an RF electrode incorporated in the substrate support; and
    an upper ring, the upper ring overlying the intermediate ring, wherein the upper ring has an upper surface exposed to an interior of the plasma reaction chamber, wherein the lower ring is in direct contact with the RF electrode.

2. The assembly of claim 1, wherein the intermediate ring is made of aluminum oxide.

3. The assembly of claim 1, wherein the intermediate ring is made of quartz, silicon, silicon carbide or aluminum oxide.

4. The assembly of claim 1, wherein the lower ring is made of aluminum or alloy thereof.

5. The assembly of claim 1, wherein the lower ring is made of aluminum, aluminum alloy, brass, copper, copper alloy or stainless steel.

6. The assembly of claim 1, wherein a lower surface of the upper ring is bonded to an upper surface of the intermediate ring via a thermally conductive elastomer.

7. The assembly of claim 1, wherein the lower ring has a plurality of holes configured to bolt the lower ring to the RF electrode.

8. The assembly of claim 7, further comprising a first bolt having a tapered head at one end and a screw thread at the other end, the first bolt configured to bolt the lower ring to the RF electrode.

9. The assembly of claim 1, wherein the lower ring and the intermediate ring have a plurality of holes configured to bolt the intermediate ring to the lower ring.

10. The assembly of claim 9, further comprising a second bolt having a head at one end and a screw thread at the other end, the second bolt configured to bolt the intermediate ring to the lower ring.

11. The assembly of claim 1, wherein the lower ring has a substantially L-shaped cross-section.

12. The assembly of claim 1, further comprising a conductive washer configured to receive a bolt having a head at one end and a screw thread at the other end, wherein the conductive washer is positioned between the upper ring and the intermediate ring.

13. The assembly of claim 12, further comprising a plurality of holes in the upper ring, wherein the plurality of holes receive a cap, the cap having a vent hole configured to release pressure from within the edge ring assembly.

14. The assembly of claim 1, wherein the upper ring is made of silicon, carbon, graphite, or silicon carbide.

15. The assembly of claim 1, wherein the upper ring has a portion extending under a substrate when the substrate is located on the substrate support.

16. A plasma processing apparatus comprising:
a processing chamber adapted to process a semiconductor substrate;
a power source which energizes process gas in an interior of the processing chamber into a plasma state for processing the substrate;
a substrate support which supports the substrate within the interior of the processing chamber, the substrate support including an RF electrode;
a lower ring made of an electrically conductive material;
a ceramic intermediate ring, the intermediate ring overlying the lower ring, the intermediate ring adapted to be attached via the lower ring to the RF electrode, wherein the lower ring is in direct contact with the RF electrode; and
an upper ring adapted to surround the substrate, the upper ring overlying the intermediate ring, wherein the upper ring has an upper surface exposed to an interior of the processing chamber.

17. The apparatus of claim 16, wherein the upper ring is bonded to the intermediate ring by a thermally conductive elastomer.

18. The apparatus of claim 16, wherein the lower ring is made of aluminum or alloy thereof.

19. The apparatus of claim 16, wherein the intermediate ring is made of aluminum oxide.

20. The apparatus of claim 16, wherein the upper ring is made from a material selected from the group consisting of quartz, silicon, silicon carbide, graphite and aluminum.

21. The apparatus of claim 16, wherein the plasma chamber is a semiconductor plasma etching apparatus.

22. The apparatus of claim 16, further comprising a quartz outer ring surrounding the upper ring.

23. A method of reducing process drift on a plurality of substrates in a plasma processing system comprising: positioning a substrate in the plasma processing apparatus of claim 16; supplying process gas to the chamber; forming a plasma adjacent the upper surface of the substrate support; and sequentially processing a plurality of substrates in the plasma processing apparatus, wherein the temperature of the upper ring is substantially cooled to an initial temperature after a first substrate is removed from the substrate support and before a subsequent substrate is placed on the substrate support to reduce process drift.

24. The method of claim 23, wherein the substrate comprises a semiconductor wafer and the processing step comprises etching the semiconductor wafer with the plasma.

25. The apparatus of claim 16, wherein the lower ring is made of aluminum, aluminum alloy, brass, copper, copper alloy or stainless steel.

* * * * *